(12) United States Patent
Ogata

(10) Patent No.: US 7,154,188 B2
(45) Date of Patent: Dec. 26, 2006

(54) SEMICONDUCTOR CHIP, SEMICONDUCTOR DEVICE, CIRCUIT BOARD, AND ELECTRONIC INSTRUMENT

(75) Inventor: Yoshiharu Ogata, Sakata (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/969,846

(22) Filed: Oct. 22, 2004

(65) Prior Publication Data

US 2005/0110165 A1    May 26, 2005

(30) Foreign Application Priority Data

Oct. 27, 2003    (JP)    ............... 2003-366078

(51) Int. Cl.
*H01L 23/48*    (2006.01)
(52) U.S. Cl. .............. 257/780; 257/730; 257/678; 257/688; 257/776; 257/618; 257/622; 257/620; 257/98; 257/433
(58) Field of Classification Search ............. 257/780, 257/730, 678, 688, 776, 618, 622, 620, 98, 257/433
See application file for complete search history.

(56) References Cited

U.S. PATENT DOCUMENTS 5,982,804 A * 11/1999 Chen et al. ................ 372/96
6,711,193 B1 * 3/2004 Yamasaki ................ 372/45.01
6,777,767 B1 * 8/2004 Badehi ....................... 257/432
6,924,513 B1 * 8/2005 Akaike et al. ............... 257/98

FOREIGN PATENT DOCUMENTS

JP    B2 3299889    4/2002

* cited by examiner

*Primary Examiner*—Eddie C. Lee
*Assistant Examiner*—Junghwa Im
(74) *Attorney, Agent, or Firm*—Oliff & Berridge, PLC

(57) ABSTRACT

A semiconductor chip includes a semiconductor substrate including first and second surfaces and a plurality of side surfaces, the first and second surfaces being parallel to each other and facing in opposite directions, the side surfaces connecting peripheries of the first and second surfaces. At least one of the side surfaces is an inclined surface with respect to the first and second surfaces, and a groove is formed in the inclined surface. The groove extends in a direction which intersects a plane parallel to the first and second surfaces and extends in a direction which intersects a plane which intersects the first and second surfaces at right angles.

8 Claims, 4 Drawing Sheets

_SEMICONDUCTOR CHIP, SEMICONDUCTOR DEVICE, CIRCUIT BOARD, AND ELECTRONIC INSTRUMENT_

Japanese Patent Application No. 2003-366078, filed on Oct. 27, 2003, is hereby incorporated by reference in its entirety.

BACKGROUND OF THE INVENTION

The present invention relates to a semiconductor chip, a semiconductor device, a circuit board, and an electronic instrument.

A wafer in which an integrated circuit is formed is made of a semiconductor, and easily breaks. Therefore, since a semiconductor chip obtained by dicing the wafer also easily breaks, the semiconductor chip more easily breaks if unevenness is formed on the surface of the semiconductor chip. Therefore, it is desirable to prevent the semiconductor chip from easily breaking when forming unevenness on the surface of the semiconductor chip.

BRIEF SUMMARY OF THE INVENTION

According to one aspect of the present invention, there is provided a semiconductor chip comprising:

a semiconductor substrate including first and second surfaces and a plurality of side surfaces, the first and second surfaces being parallel to each other and facing in opposite directions, the side surfaces connecting peripheries of the first and second surfaces;

an integrated circuit formed in the first surface of the semiconductor substrate; and electrodes formed on the first surface of the semiconductor substrate, wherein at least one of the side surfaces is an inclined surface with respect to the first and second surfaces, wherein a groove is formed in the inclined surface, and wherein the groove extends in a direction which intersects a plane parallel to the first and second surfaces and extends in a direction which intersects a plane which intersects the first and second surfaces at right angles.

According to another aspect of the present invention, there is provided a semiconductor device comprising:

any one of the above described semiconductor chips; and a substrate on which an interconnect pattern is formed, wherein the electrodes of the semiconductor chip are electrically connected with the interconnect pattern.

According to a further aspect of the present invention, there is provided a circuit board on which is mounted the above described semiconductor device.

According to still another aspect of the present invention, there is provided an electronic instrument comprising the above described semiconductor device.

DETAILED DESCRIPTION OF THE EMBODIMENT

Figure 1:
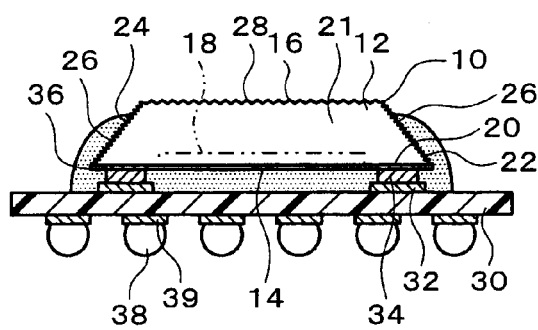
FIG. 1 is a view illustrating a semiconductor device according to the first embodiment of the present invention.

An objective of the present invention is to form unevenness on the surface of a semiconductor chip without causing the semiconductor chip to easily break.

(1) According to an embodiment of the present invention, there is provided a semiconductor chip comprising:

a semiconductor substrate including first and second surfaces and a plurality of side surfaces, the first and second surfaces being parallel to each other and facing in opposite directions, the side surfaces connecting peripheries of the first and second surfaces;

an integrated circuit formed in the first surface of the semiconductor substrate; and electrodes formed on the first surface of the semiconductor substrate, wherein at least one of the side surfaces is an inclined surface with respect to the first and second surfaces, wherein a groove is formed in the inclined surface, and wherein the groove extends in a direction which intersects a plane parallel to the first and second surfaces and extends in a direction which intersects a plane which intersects the first and second surfaces at right angles.

According to one embodiment of the present invention, unevenness can be formed on a side surface of the semiconductor substrate by forming the groove. An increase in heat radiation properties and an increase in adhesion to an adhesive can be obtained by forming the unevenness. Moreover, since the groove extends to intersect the direction along which the semiconductor substrate tends to break, the semiconductor chip does not easily break.

(2) In the semiconductor chip, an angle formed by the first surface and the inclined surface may be an acute angle inside the semiconductor substrate.

(3) In the semiconductor chip, an angle formed by the first surface and the inclined surface may be an obtuse angle inside the semiconductor substrate.

(4) In the semiconductor chip, a pair of the side surfaces adjacent to each other may be first and second inclined surfaces.

(5) In the semiconductor chip, an angle formed by the first surface and the first inclined surface may be an acute angle inside the semiconductor substrate, and an angle formed by the first surface and the second inclined surface may be an obtuse angle inside the semiconductor substrate.

(6) In the semiconductor chip, the second surface may be a rectangle; and a groove which extends in a direction which intersects all sides of the rectangle may be formed in the second surface.

(7) According to another embodiment of the present invention, there is provided a semiconductor device comprising:

any one of the above described semiconductor chips; and a substrate on which an interconnect pattern is formed, wherein the electrodes of the semiconductor chip are electrically connected with the interconnect pattern.

(8) According to a further embodiment of the present invention, there is provided a circuit board on which is mounted the above described semiconductor device.

(9) According to still another embodiment of the present invention, there is provided an electronic instrument comprising the above described semiconductor device.

First Embodiment

Figure 2:
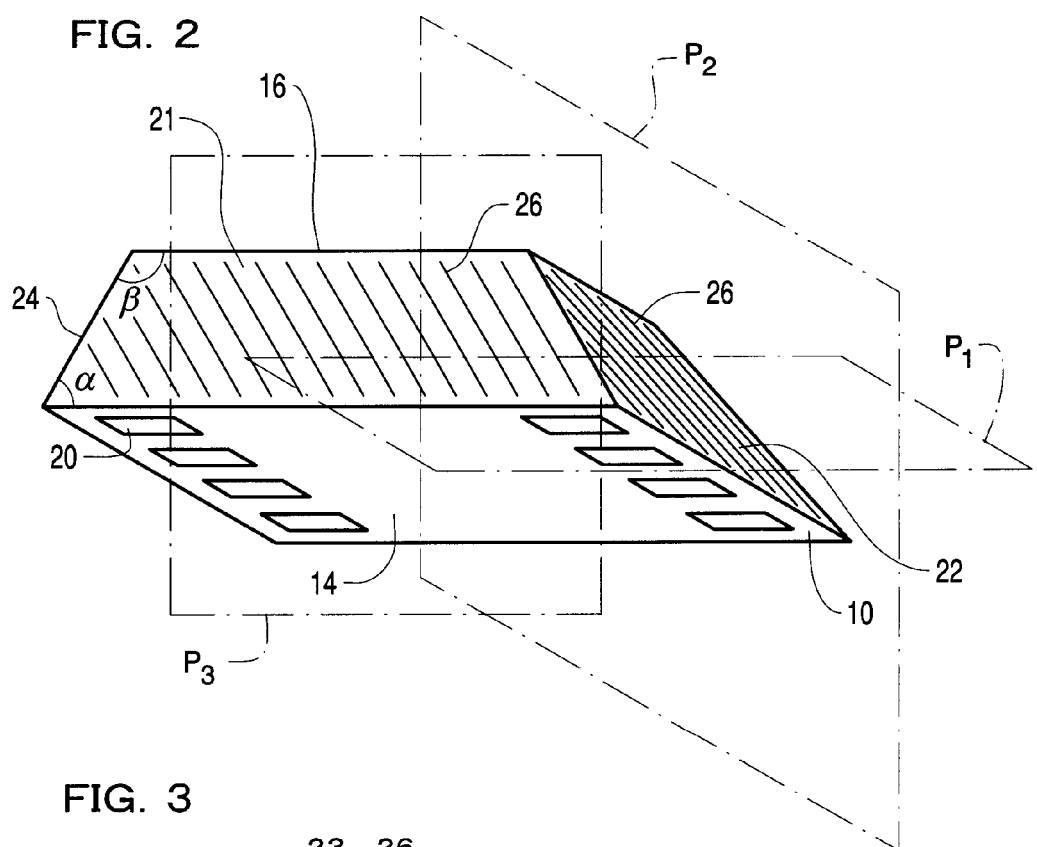
FIG. 2 is a perspective view showing an outline of a semiconductor chip according to the first embodiment of the present invention.
Figure 3:
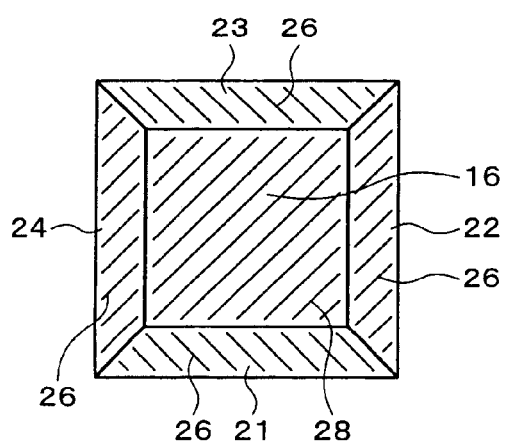
FIG. 3 is a plan view showing an outline of a semiconductor chip according to the first embodiment of the present invention.

FIG. 1 is a view illustrating a semiconductor device according to the first embodiment of the present invention. The semiconductor device includes a semiconductor chip 10. FIG. 2 is a perspective view showing an outline of the semiconductor chip according to the first embodiment of the present invention, and FIG. 3 is a plan view showing an outline of the semiconductor chip according to the first embodiment of the present invention.

The semiconductor chip 10 includes a semiconductor substrate 12. The semiconductor substrate 12 is formed of a crystal of a semiconductor such as silicon. The semiconductor substrate 12 includes first and second parallel surfaces 14 and 16 which face in opposite directions. At least one (only one or both) of the first and second surfaces 12 and 14 may be rectangular. The first surface 14 is larger than the second surface 16. The second surface 16 is positioned so that the entire second surface 16 overlaps the first surface 14.

An integrated circuit 18 is formed in the first surface 14. A plurality of electrodes 20 are formed on the first surface 14. The electrodes 20 are electrically connected with the inside of the semiconductor substrate 12. All the electrodes 20 or some of the electrodes 20 are electrically connected with the integrated circuit 18.

The semiconductor substrate 12 includes a plurality of side surfaces 21 to 24 which connect the edges of the first and second surfaces 14 and 16. At least one (all in the present embodiment) of the side surfaces 21 to 24 is an inclined surface with respect to the first and second surfaces 14 and 16. An angle α formed by at least one (all in the present embodiment) of the side surfaces (inclined surfaces) 21 to 24 and the first surface 14 is an acute angle inside the semiconductor substrate 12. An angle β formed by at least one (all in the present embodiment) of the side surfaces (inclined surfaces) 21 to 24 and the second surface 16 is an obtuse angle inside the semiconductor substrate 12. A pair of adjacent side surfaces 21 and 22 (or 22 and 23, 23 and 24, or 24 and 21) is inclined, and the pair of adjacent side surfaces may be defined as first and second inclined surfaces.

In the present embodiment, a groove 26 is formed in at least one (all in the present embodiment) of the side surfaces 21 to 24. A plurality of grooves 26 may be formed in one side surface 21, 22, 23, or 24. In this case, the grooves 26 may be formed in parallel. The groove 26 extends in the direction which intersects a plane $P_1$ (see FIG. 2) parallel to the first and second surfaces 14 and 16. The groove 26 extends in the direction which intersects at least one (all in the present embodiment) of planes $P_2$ and $P_3$ and the like (see FIG. 2) which intersect the first and second surfaces 14 and 16 at right angles.

According to the present embodiment, unevenness can be formed on at least one (all in the present embodiment) of the side surfaces 21 to 24 of the semiconductor substrate 12 by forming the groove 26. An increase in heat-sink properties of the semiconductor substrate 12 and an increase in adhesion to an adhesive can be obtained by forming the unevenness. Moreover, since the groove 26 extends to intersect the direction along which the semiconductor substrate 12 tends to break, the semiconductor chip does not easily break.

In the present embodiment, a groove 28 is formed in the second surface 16. A plurality of grooves 28 may be formed in the second surface 16. In this case, the grooves 28 may be arranged in parallel. In the case where the second surface 16 is a rectangle, the groove 28 may extend in the direction which intersects all sides of the rectangle. Unevenness can be formed on the second surface 16 of the semiconductor substrate 12 by forming the groove 28. An increase in heat-sink properties of the semiconductor substrate 12 and an increase in adhesion to an adhesive or a sealing material can be obtained by forming the unevenness. Moreover, since the groove 28 extends to intersect the direction along which the semiconductor substrate 12 tends to break, the semiconductor chip does not easily break.

As shown in FIG. 1, the semiconductor device includes a substrate 30. An interconnect pattern 32 is formed on the substrate 30. The semiconductor chip 10 is mounted on the substrate 30. The first surface 14 of the semiconductor chip 10 faces the substrate 30. The semiconductor chip 10 and the substrate 30 are bonded through an adhesive 36. At least a part of the adhesive 36 is provided between the semiconductor chip 10 and the substrate 30 to bond the semiconductor chip 10 and the substrate 30. A part of the adhesive 36 may adhere to the side surfaces 21 to 24 of the semiconductor chip 10. Since the unevenness is formed on the side surfaces 21 to 24 by the grooves 26, the side surfaces 21 to 24 have high adhesion to the adhesive 36. The electrode 20 (or bump 34 formed on the electrode 20) may face the interconnect pattern 32. The electrode 20 is electrically connected with the interconnect pattern 32. The electrical connection may be achieved by a metal junction between the electrode 20 (or bump 34 formed on the electrode 20) and the interconnect pattern 32. In the case where the adhesive 36 is an anisotropic conductive material (anisotropic conductive film or anisotropic conductive paste) containing conductive particles, the electrical connection may be achieved by allowing the conductive particles to be present between the electrode 20 (or bump 34 formed on the electrode 20) and the interconnect pattern 32.

The semiconductor device may include an external terminal (solder ball, for example) 38. The external terminal 38 is formed on the substrate 30 on the side opposite to the semiconductor chip 10. The external terminal 38 may be formed on a land 39 which is formed on the substrate 30 on the side opposite to the side on which the interconnect pattern 32 is formed. The land 39 is electrically connected with the interconnect pattern 32 through a through-hole (not shown) formed in the substrate 30 or the like. A method of manufacturing the semiconductor device according to the present embodiment includes items which can be derived from the above-described configuration.

A method of manufacturing the semiconductor chip 10 according to the present embodiment includes forming the semiconductor substrate 12 in which the groove 26 is formed. For example, the semiconductor substrate 12 may be cut from a semiconductor wafer so as to include the flat side surfaces 21 to 24, and the groove 26 may be formed thereafter. The groove 26 may be formed by scribing or polishing. When cutting the semiconductor substrate 12 from the semiconductor wafer, the grooves 26 may be formed in the side surfaces 21 to 24 as the cutting surfaces. The groove 28 may be formed, by scribing or polishing, in the semiconductor wafer or the second surface 16 of the semiconductor substrate 12 obtained by cutting the semiconductor wafer.

Second Embodiment

Figure 4:
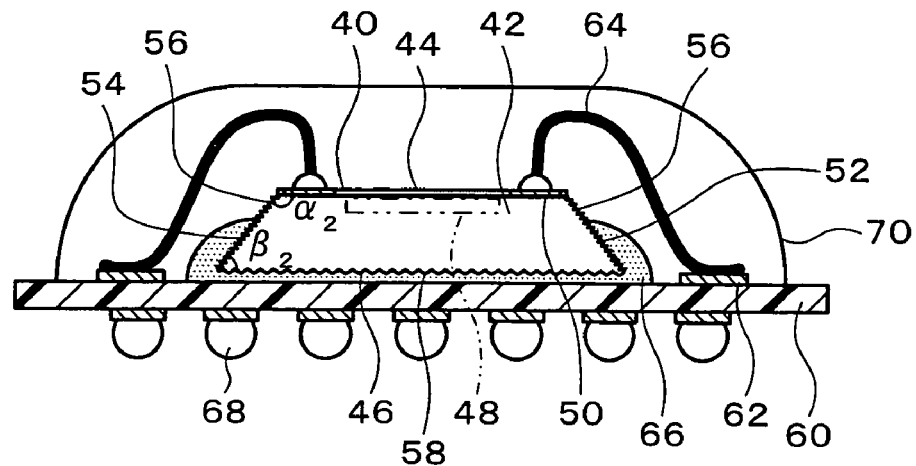
FIG. 4 is a view illustrating a semiconductor device according to the second embodiment of the present invention.
Figure 5:
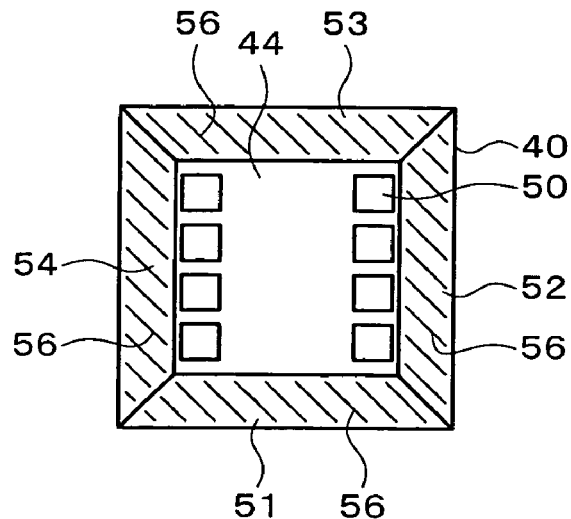
FIG. 5 is a top view showing an outline of a semiconductor chip according to the second embodiment of the present invention.
Figure 6:
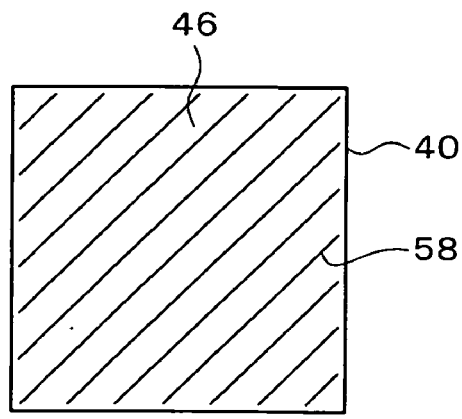
FIG. 6 is a bottom view showing an outline of a semiconductor chip according to the second embodiment of the present invention.

FIG. 4 is a view illustrating a semiconductor device according to the second embodiment of the present invention. The semiconductor device includes a semiconductor chip 40. FIG. 5 is a top view showing an outline of the semiconductor chip according to the second embodiment of the present invention, and FIG. 6 is a bottom view showing an outline of the semiconductor chip according to the second embodiment of the present invention.

The semiconductor chip 40 includes a semiconductor substrate 42. The semiconductor substrate 42 is formed of a crystal of a semiconductor such as silicon. The semiconductor substrate 42 includes first and second parallel surfaces 44 and 46 which face in opposite directions. At least one (only one or both) of the first and second surfaces 44 and 46 may be rectangular. The first surface 44 is smaller than the second surface 46. The first surface 44 is positioned so that the entire first surface 44 overlaps the second surface 46.

An integrated circuit 48 is formed in the first surface 44. A plurality of electrodes 50 are formed on the first surface 44. The electrodes 50 are electrically connected with the inside of the semiconductor substrate 42. All the electrodes 50 or some of the electrodes 50 are electrically connected with the integrated circuit 48.

The semiconductor substrate 42 includes a plurality of side surfaces 51 to 54 which connect the edges of the first and second surfaces 44 and 46. At least one (all in the present embodiment) of the side surfaces 51 to 54 is an inclined surface with respect to the first and second surfaces 44 and 46. An angle $\alpha_2$ formed by at least one (all in the present embodiment) of the side surfaces (inclined surfaces) 51 to 54 and the first surface 44 is an obtuse angle inside the semiconductor substrate 42. An angle $\beta_2$ formed by at least one (all in the present embodiment) of the side surfaces (inclined surfaces) 51 to 54 and the second surface 46 is an acute angle inside the semiconductor substrate 42. A pair of adjacent side surfaces 51 and 52 (or 52 and 53, 53 and 54, or 54 and 51) is inclined, and the pair of adjacent side surfaces may be defined as first and second inclined surfaces.

In the present embodiment, a groove 56 is formed in at least one (all in the present embodiment) of the side surfaces 51 to 54. A plurality of grooves 56 may be formed in one side surface 51, 52, 53, or 54. In this case, the grooves 56 may be formed in parallel. The groove 56 extends in the direction which intersects a plane parallel to the first and second surfaces 44 and 46. The groove 56 extends in the direction which intersects at least one (all in the present embodiment) of planes which intersect the first and second surfaces 44 and 46 at right angles.

According to the present embodiment, unevenness can be formed on at least one (all in the present embodiment) of the side surfaces 51 to 54 of the semiconductor substrate 42 by forming the groove 56. An increase in heat-sink properties of the semiconductor substrate 42 and an increase in adhesion to an adhesive can be obtained by forming the unevenness. Moreover, since the groove 56 extends to intersect the direction along which the semiconductor substrate 42 tends to break, the semiconductor chip does not easily break.

In the present embodiment, a groove 58 is formed in the second surface 46. A plurality of grooves 58 may be formed in the second surface 46. In this case, the grooves 58 may be arranged in parallel. In the case where the second surface 46 is a rectangle, the groove 58 may extend in the direction which intersects all sides of the rectangle. Unevenness can be formed on the second surface 46 of the semiconductor substrate 42 by forming the groove 58. An increase in heat-sink properties of the semiconductor substrate 42 and an increase in adhesion to an adhesive or a sealing material can be obtained by forming the unevenness. Moreover, since the groove 58 extends to intersect the direction along which the semiconductor substrate 42 tends to break, the semiconductor chip does not easily break.

As shown in FIG. 4, the semiconductor device includes a substrate 60. An interconnect pattern 62 is formed on the substrate 60. The semiconductor chip 40 is mounted on the substrate 60. The second surface 46 of the semiconductor chip 40 faces the substrate 60. The semiconductor chip 40 and the substrate 60 are bonded through an adhesive 66. At least a part of the adhesive 66 is provided between the semiconductor chip 40 and the substrate 60 to bond the semiconductor chip 40 and the substrate 60. Since the unevenness is formed on the second surface 46 of the semiconductor chip 40 by the groove 58, the second surface 46 has high adhesion to the adhesive 66. A part of the adhesive 66 may adhere to the side surfaces 51 to 54 of the semiconductor chip 40. Since the unevenness is formed on the side surfaces 51 to 54 by the grooves 56, the side surfaces 51 to 54 have high adhesion to the adhesive 66. The electrode 50 is electrically connected with the interconnect pattern 62. The electrical connection may be achieved by using a wire 64. The semiconductor device may include an external terminal (solder ball, for example) 68 (see the external terminal 38 described in the first embodiment for details). The semiconductor device may include a sealing section 70. The sealing section 70 seals the semiconductor chip 40. Since the unevenness is formed on the side surfaces 51 to 54 of the semiconductor chip 40 by the grooves 56, the side surfaces 51 to 54 have high adhesion to the sealing section 70. A method of manufacturing the semiconductor device according to the present embodiment includes items which can be derived from the above-described configuration.

A method of manufacturing the semiconductor chip 40 according to the present embodiment includes forming the semiconductor substrate 42 in which the groove 56 is formed. For example, the semiconductor substrate 42 may be cut from a semiconductor wafer so as to include the flat side surfaces 51 to 54, and the groove 56 may be formed thereafter. The groove 56 may be formed by scribing or polishing. When cutting the semiconductor substrate 42 from the semiconductor wafer, the grooves 56 may be formed in the side surfaces 51 to 54 as the cutting surfaces. The grooves 58 may be formed, by scribing or polishing, in the semiconductor wafer or the second surface 46 of the semiconductor substrate 42 obtained by cutting the semiconductor wafer.

Modification

FIGS. 7 to 10 are plan views illustrating modifications of the semiconductor chip according to the embodiment of the present invention. These modifications relate to the external shape of the semiconductor chip. The items of the above-described embodiment apply to each modification excluding the items described below.

Figure 7:
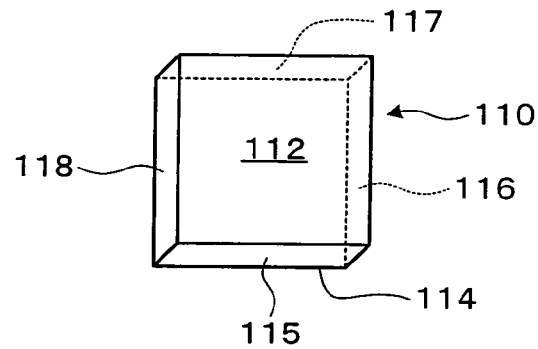
FIG. 7 is a plan view illustrating a modification of a semiconductor chip according to an embodiment of the present invention.

A semiconductor chip 110 shown in FIG. 7 includes first and second parallel surfaces 112 and 114 which face in opposite directions, and a plurality of side surfaces 115 to 118 which connect the edges of the first and second surfaces 112 and 114. The angles formed by the first surface 112 and the side surfaces (first inclined surfaces) 116 and 117 are acute angles inside the semiconductor substrate. The angles formed by the first surface 112 and the side surfaces (second inclined surfaces) 115 and 118 are obtuse angles inside the semiconductor substrate. A pair of side surfaces 115 and 118 which make obtuse angles with the first surface 112 inside the semiconductor substrate is adjacent to each other. A pair of side surfaces 116 and 117 which make acute angles with the first surface 112 inside the semiconductor substrate is adjacent to each other. The side surface 115 (or 118) which makes an obtuse angle with the first surface 112 inside the semiconductor substrate is adjacent to the side surface 116 (or 117) which makes an acute angle with the first surface 112 inside the semiconductor substrate.

Figure 8:
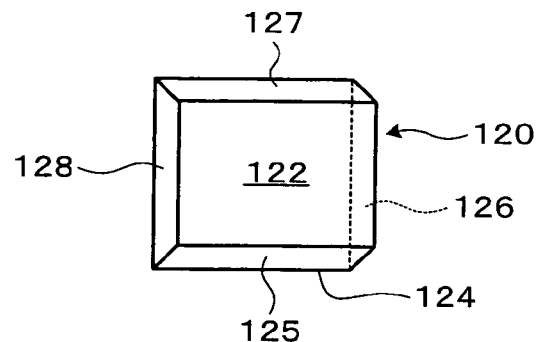
FIG. 8 is a plan view illustrating another modification of a semiconductor chip according to an embodiment of the present invention.

A semiconductor chip 120 shown in FIG. 8 includes first and second parallel surfaces 122 and 124 which face in opposite directions, and a plurality of side surfaces 125 to 128 which connect the edges of the first and second surfaces 122 and 124. The angle formed by the first surface 122 and the side surface (first inclined surface) 126 is an acute angle inside the semiconductor substrate. The angles formed by the first surface 122 and the side surfaces (second inclined surfaces) 125, 127, and 128 are obtuse angles inside the semiconductor substrate. The side surface 128 which makes an obtuse angle with the first surface 122 inside the semiconductor substrate is adjacent to the side surfaces 125 and 127 which make obtuse angles with the first surface 122 inside the semiconductor substrate. The side surface 126 which makes an acute angle with the first surface 122 inside the semiconductor substrate is adjacent to the side surfaces 125 and 127 which make obtuse angles with the first surface 122 inside the semiconductor substrate.

Figure 9:
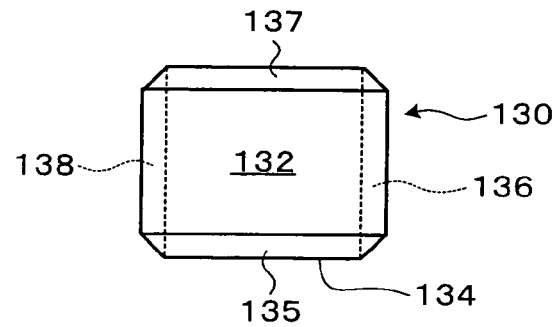
FIG. 9 is a plan view illustrating still another modification of a semiconductor chip according to an embodiment of the present invention.

A semiconductor chip 130 shown in FIG. 9 includes first and second parallel surfaces 132 and 134 which face in opposite directions, and a plurality of side surfaces 135 to 138 which connect the edges of the first and second surfaces 132 and 134. The angles formed by the first surface 132 and the side surfaces (first inclined surfaces) 136 and 138 are acute angles inside the semiconductor substrate. The angles formed by the first surface 132 and the side surfaces (second inclined surfaces) 135 and 137 are obtuse angles inside the semiconductor substrate. The side surface 136 (or 138) which makes an acute angle with the first surface 132 inside the semiconductor substrate is adjacent to the side surface 135 (or 137) which makes an obtuse angle with the first surface 132 inside the semiconductor substrate.

Figure 10:
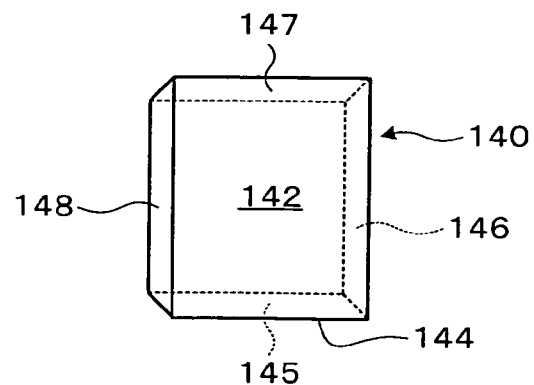
FIG. 10 is a plan view illustrating still another modification of a semiconductor chip according to an embodiment of the present invention.

A semiconductor chip 140 shown in FIG. 10 includes first and second parallel surfaces 142 and 144 which face in opposite directions, and a plurality of side surfaces 145 to 148 which connect the edges of the first and second surfaces 142 and 144. The angles formed by the first surface 142 and the side surfaces (first inclined surfaces) 145, 146, and 147 are acute angles inside the semiconductor substrate. The angle formed by the first surface 142 and the side surface (second inclined surface) 148 is an obtuse angle inside the semiconductor substrate. The side surface 146 which makes an acute angle with the first surface 142 inside the semiconductor substrate is adjacent to the side surfaces 145 and 147 which make acute angles with the first surface 142 inside the semiconductor substrate. The side surface 148 which makes an obtuse angle with the first surface 142 inside the semiconductor substrate is adjacent to the side surfaces 145 and 147 which make acute angles with the first surface 142 inside the semiconductor substrate.

Figure 11:
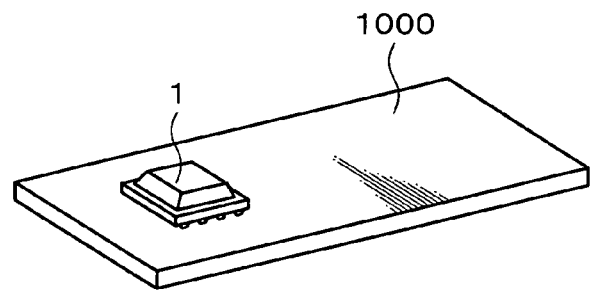
FIG. 11 is a view showing a circuit board on which a semiconductor device according to an embodiment of the present invention is mounted.
Figure 12:
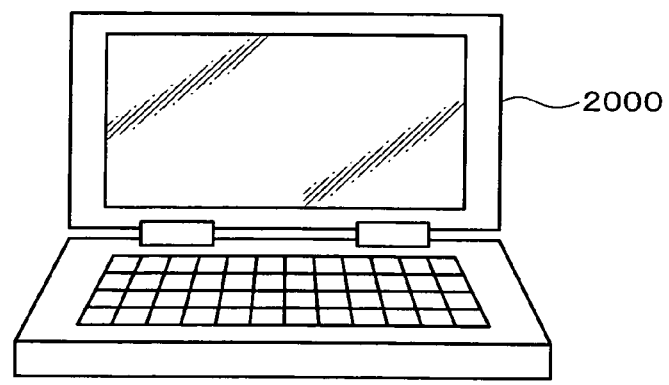
FIG. 12 shows an electronic instrument having a semiconductor device according to an embodiment of the present invention.
Figure 13:
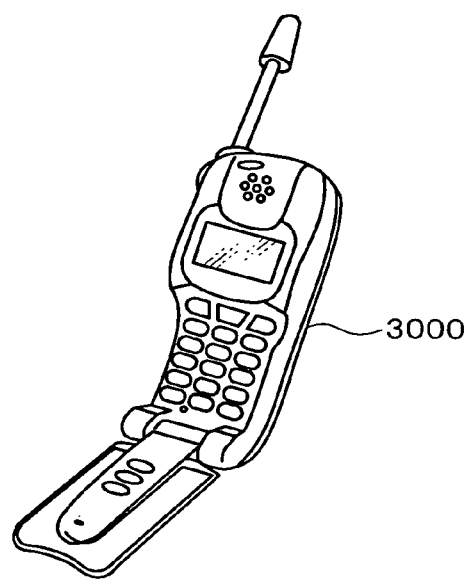
FIG. 13 shows another electronic instrument having a semiconductor device according to an embodiment of the present invention.

FIG. 11 shows a circuit board 1000 on which a semiconductor device 1 described in the above embodiment is mounted. FIGS. 12 and 13 respectively show a notebook-type personal computer 2000 and a portable telephone 3000 as electronic instruments including this semiconductor device.

Although only some embodiments of the present invention have been described in detail above, those skilled in the art will readily appreciate that many modifications are possible in the embodiments without materially departing from the novel teachings and advantages of this invention. Accordingly, all such modifications are intended to be included within scope of this invention.

What is claimed is:

1. A semiconductor chip comprising:
   a semiconductor substrate including first and second surfaces and a plurality of side surfaces, the first and second surfaces being parallel to each other and facing in opposite directions, the side surfaces connecting peripheries of the first and second surfaces;
   an integrated circuit formed in the first surface of the semiconductor substrate; and
   electrodes formed on the first surface of the semiconductor substrate, wherein at least one of the side surfaces is an inclined surface with respect to the first and second surfaces,
   wherein a first groove is formed in the inclined surface, and
   wherein the first groove extends in a direction which intersects a plane parallel to the first and second surfaces and extends in a direction which intersects every plane which intersects the first and second surfaces at right angles
   wherein the second surface is a rectangle; and
   wherein a plurality of second grooves, which are formed in the second surface, extends in a direction which intersects all sides of the rectangle.

2. The semiconductor chip as defined in claim 1,
   wherein an angle formed by the first surface and the inclined surface is an acute angle inside the semiconductor substrate.

3. The semiconductor chip as defined in claim 1,
   wherein an angle formed by the first surface and the inclined surface is an obtuse angle inside the semiconductor substrate.

4. The semiconductor chip as defined in claim 1,
wherein a pair of the side surfaces adjacent to each other is first and second inclined surfaces.

5. The semiconductor chip as defined in claim 4,
wherein an angle formed by the first surface and the first inclined surface is an acute angle inside the semiconductor substrate, and
wherein an angle formed by the first surface and the second inclined surface is an obtuse angle inside the semiconductor substrate.

6. A semiconductor device comprising:
the semiconductor chip as defined in claim 1; and
a substrate on which an interconnect pattern is formed,
wherein the electrodes of the semiconductor chip are electrically connected with the interconnect pattern.

7. A circuit board on which is mounted the semiconductor device as defined in claim 6.

8. An electronic instrument comprising the semiconductor device as defined in claim 6.

* * * * *